US010850686B2

(12) United States Patent
Tashiro et al.

(10) Patent No.: US 10,850,686 B2
(45) Date of Patent: Dec. 1, 2020

(54) ELECTRICAL CONNECTION BOX AND WIRE HARNESS

(71) Applicant: Yazaki Corporation, Tokyo (JP)

(72) Inventors: Hiroki Tashiro, Shizuoka (JP); Masahiro Wada, Shizuoka (JP); Ryouichi Yokoyama, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/530,000

(22) Filed: Aug. 2, 2019

(65) Prior Publication Data
US 2020/0070754 A1    Mar. 5, 2020

(30) Foreign Application Priority Data
Aug. 31, 2018    (JP) ................. 2018-162706

(51) Int. Cl.
| H01R 9/24 | (2006.01) |
| B60R 16/023 | (2006.01) |
| H02G 3/16 | (2006.01) |
| H02G 3/08 | (2006.01) |
| H05K 7/00 | (2006.01) |
| H05K 3/30 | (2006.01) |
| B60R 16/02 | (2006.01) |

(52) U.S. Cl.
CPC ...... *B60R 16/0238* (2013.01); *B60R 16/0207* (2013.01); *H02G 3/088* (2013.01); *H02G 3/16* (2013.01); *H05K 3/30* (2013.01); *H05K 7/00* (2013.01)

(58) Field of Classification Search
CPC .. B60R 16/0238; B60R 16/0207; H02G 3/16; H02G 3/088; H02G 3/086; H02G 3/08; H05K 7/00; H05K 3/30
See application file for complete search history.

(56) References Cited

U.S. PATENT DOCUMENTS 5,478,244 A * 12/1995 Maue ................. B60R 16/0238
                                                      361/752
5,755,579 A * 5/1998 Yanase ..................... H02G 3/16
                                                      439/76.2
(Continued)

FOREIGN PATENT DOCUMENTS

JP    2009-207222 A    9/2009
JP    2014236655 A    12/2014

*Primary Examiner* — Truc T Nguyen
(74) *Attorney, Agent, or Firm* — Sughrue Mion, PLLC

(57) ABSTRACT

An electrical connection box includes a housing including at least a first and a second divided housings having annular peripheral edge portions of openings formed by outer peripheral walls that are fitted with each other. The first divided housing includes a first assembly member having a first outer wall body in which a cutout portion is formed, a second assembly member embedding the cutout portion and having a second outer wall body forming the outer peripheral wall 11 together with the first outer wall body, and a lock structure holding the first assembly member and the second assembly member in a completely assembled state. A first engagement body of the lock structure is provided on the first assembly member on the inner side relative to the cutout portion, and a second engagement body is provided on the second outer wall body on the inner wall surface side.

6 Claims, 6 Drawing Sheets

(56) References Cited

U.S. PATENT DOCUMENTS

| | | | |
|---|---|---|---|
| 2006/0208583 A1* | 9/2006 | Ueno | H01R 4/2433 |
| | | | 310/71 |
| 2016/0242303 A1* | 8/2016 | Maebashi | B60R 16/0238 |
| 2016/0315458 A1* | 10/2016 | Kamo | B60R 16/0238 |
| 2017/0070040 A1* | 3/2017 | Kawada | B60R 16/0238 |
| 2018/0013276 A1* | 1/2018 | Ikeda | H01R 9/2416 |
| 2018/0065576 A1* | 3/2018 | Kawaguchi | H02G 3/088 |
| 2018/0229673 A1* | 8/2018 | Nakano | B60R 16/0207 |

* cited by examiner

ELECTRICAL CONNECTION BOX AND WIRE HARNESS

CROSS-REFERENCE TO RELATED APPLICATION(S)

The present application claims priority to and incorporates by reference the entire contents of Japanese Patent Application No. 2018-162706 filed in Japan on Aug. 31, 2018.

BACKGROUND OF THE INVENTION

1. Field of the Invention

The present invention relates to an electrical connection box and a wire harness.

2. Description of the Related Art

Conventionally, electrical connection boxes accommodate therein electronic components and electric wires and enable the electric wires to be drawn out to the outer side to cause the electronic components to be electrically connected to external connection targets. The electrical connection box configures a wire harness together with the electronic components and the electric wires. The electrical connection box includes a housing formed by assembling a plurality of divided housings and has an accommodation chamber of the electronic components and the electric wires inside the housing. The housing is formed by fitting annular peripheral edge portions of openings formed by outer peripheral walls of the divided housings. Some divided housings are formed by assembling a plurality of assembly members. For example, Japanese Patent Application Laid-open No. 2009-207222 discloses an electrical connection box including a divided housing of this type. In the electrical connection box disclosed in Japanese Patent Application Laid-open No. 2009-207222, one divided housing is formed by providing a cutout portion in the outer peripheral wall of one assembly member and assembling another assembly member thereon so as to embed the cutout portion.

When the divided housing is formed by the assembly members, the assembly members should be assembled with an accurate positional relation. For example, when the assembly members are not assembled with the accurate positional relation in the housing, the divided housings cannot be preferably assembled or foreign matters can enter from spaces between the assembly members.

SUMMARY OF THE INVENTION

An object of the present invention is to provide an electrical connection box and a wire harness capable of detecting erroneous assembly between assembly members.

In order to achieve the above mentioned object, an electrical connection box according to one aspect of the present invention includes a housing in which an accommodation chamber of an electronic component is formed by a plurality of assembled divided housings and that enables an electric wire electrically connected to the electronic component to be drawn out to an outer side, wherein the housing includes, as the divided housings, at least a first divided housing and a second divided housing having annular peripheral edge portions of openings formed by outer peripheral walls that are fitted with each other, the first divided housing includes a first assembly member having a first outer wall body in which a cutout portion is formed, a second assembly member embedding the cutout portion with assembly on the first assembly member and having a second outer wall body forming the outer peripheral wall of the first divided housing together with the first outer wall body, and a lock structure holding the first assembly member and the second assembly member in a completely assembled state, the second outer wall body has flexibility capable of deflecting in a direction intersecting with an inner wall surface and an outer wall surface of the second outer wall body, the lock structure includes a first engagement body of the first assembly member and a second engagement body of the second assembly member that are locked by each other in a locking direction along the inner wall surface and the outer wall surface of the second outer wall body to be made into a completely engaged state when the first assembly member and the second assembly member are made into the completely assembled state and hold the first assembly member and the second assembly member in the completely assembled state, the first engagement body is provided on the first assembly member on an inner side relative to the cutout portion, the second engagement body is provided on the second outer wall body on the inner wall surface side, and the peripheral edge portion of the outer peripheral wall of the second divided housing has an annular first fitting portion that is fitted with an outer wall surface of the peripheral edge portion of the outer peripheral wall of the first divided housing when the first divided housing and the second divided housing are in a completely fitted state, and a second fitting portion that is fitted with the outer wall surface of the second outer wall body on an opposite side to the second engagement body when the first divided housing and the second divided housing are in the completely fitted state.

According to another aspect of the present invention, in the electrical connection box, it is desirable that the second fitting portion is arranged so as to oppose, in a fitted state, the outer wall surface of the second outer wall body on the opposite side to the second engagement body when the first divided housing and the second divided housing are in the completely fitted state.

According to still another aspect of the present invention, in the electrical connection box, it is desirable that the first engagement body and the second engagement body have locking portions that are locked by each other in the locking direction when the first assembly member and the second assembly member are in the completely assembled state and are formed to cause the second outer wall body to deflect in a half-engaged state where the locking portions climb on each other in a direction intersecting with the locking direction and cause the second outer wall body to be pressed into a fitting trajectory of the peripheral edge portion of the outer peripheral wall of the second divided housing when the first divided housing and the second divided housing are fitted with each other.

According to still another aspect of the present invention, in the electrical connection box, it is desirable that at least one of the locking portions is made to project to the other side as a locking target.

According to still another aspect of the present invention, in the electrical connection box, it is desirable that the first assembly member and the second assembly member are formed to be assembled on each other along an assembly direction as an opposite direction to the locking direction, and the locking portions are both formed to climb on each other, and then, climb over each other in conjunction with an assembly operation of the first assembly member and the second assembly member, and the locking portions are locked by each other in the locking direction in a state after the locking portions climb over each other to cause the first engagement body and the second engagement body to be made into the completely engaged state.

In order to achieve the above mentioned object, a wire harness according to still another aspect of the present invention includes an electronic component; an electric wire that is electrically connected to the electronic component; and a housing in which an accommodation chamber of the electronic component is formed by a plurality of assembled divided housings and that enables the electric wire to be drawn out to an outer side, wherein the housing includes, as the divided housings, at least a first divided housing and a second divided housing having annular peripheral edge portions of openings formed by outer peripheral walls that are fitted with each other, the first divided housing includes a first assembly member having a first outer wall body in which a cutout portion is formed, a second assembly member embedding the cutout portion with assembly on the first assembly member and having a second outer wall body forming the outer peripheral wall of the first divided housing together with the first outer wall body, and a lock structure holding the first assembly member and the second assembly member in a completely assembled state, the second outer wall body has flexibility capable of deflecting in a direction intersecting with an inner wall surface and an outer wall surface of the second outer wall body, the lock structure includes a first engagement body of the first assembly member and a second engagement body of the second assembly member that are locked by each other in a locking direction along the inner wall surface and the outer wall surface of the second outer wall body to be made into a completely engaged state when the first assembly member and the second assembly member are made into the completely assembled state and hold the first assembly member and the second assembly member in the completely assembled state, the first engagement body is provided on the first assembly member on an inner side relative to the cutout portion, the second engagement body is provided on the second outer wall body on the inner wall surface side, and the peripheral edge portion of the outer peripheral wall of the second divided housing has an annular first fitting portion that is fitted with an outer wall surface of the peripheral edge portion of the outer peripheral wall of the first divided housing when the first divided housing and the second divided housing are in a completely fitted state and a second fitting portion that is fitted with the outer wall surface of the second outer wall body on an opposite side to the second engagement body when the first divided housing and the second divided housing are in the completely fitted state.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, embodiments of a lock structure, an electrical connection box, and a wire harness according to the present invention will be described in detail with reference to the drawings. It should be noted that the embodiments do not limit the invention.

Embodiment

Hereinafter, one embodiment of the electrical connection box and the wire harness according to the present invention will be described with reference to FIG. 1 to FIG. 6.

Figure 1:
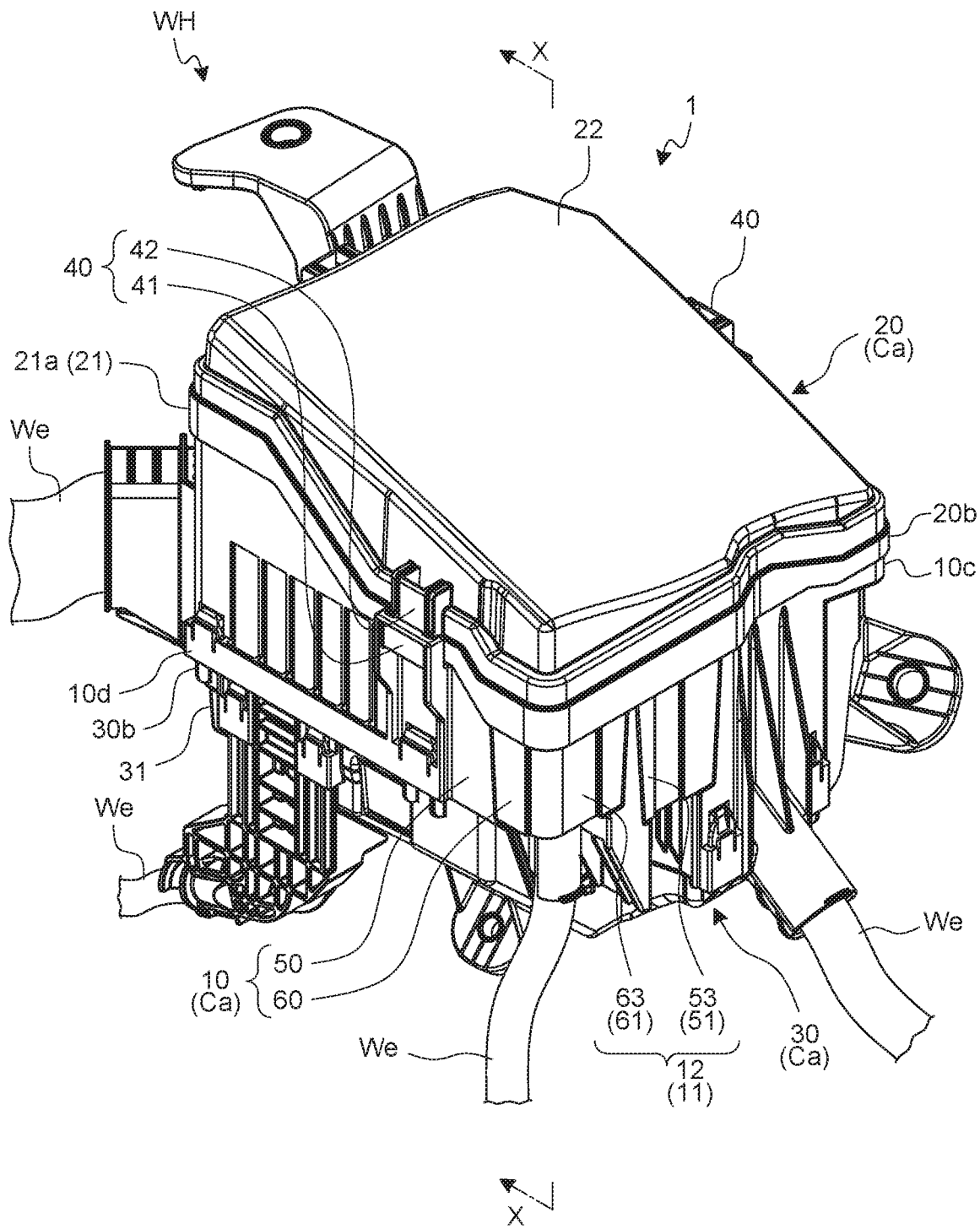
FIG. 1 is a perspective view illustrating an electrical connection box and a wire harness according to an embodiment.
Figure 2:
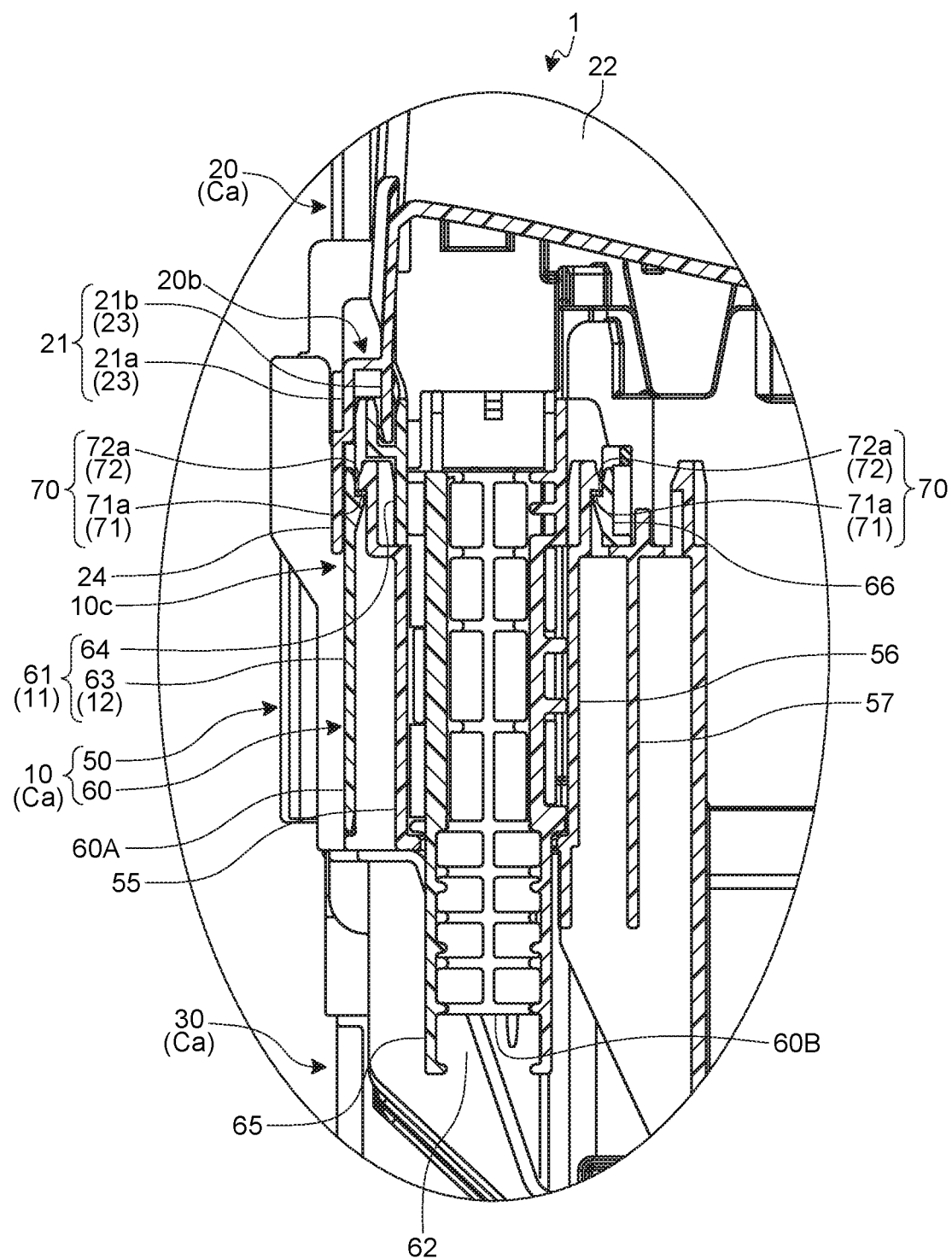
FIG. 2 is a cross-sectional view along line X-X in FIG. 1.
Figure 3:
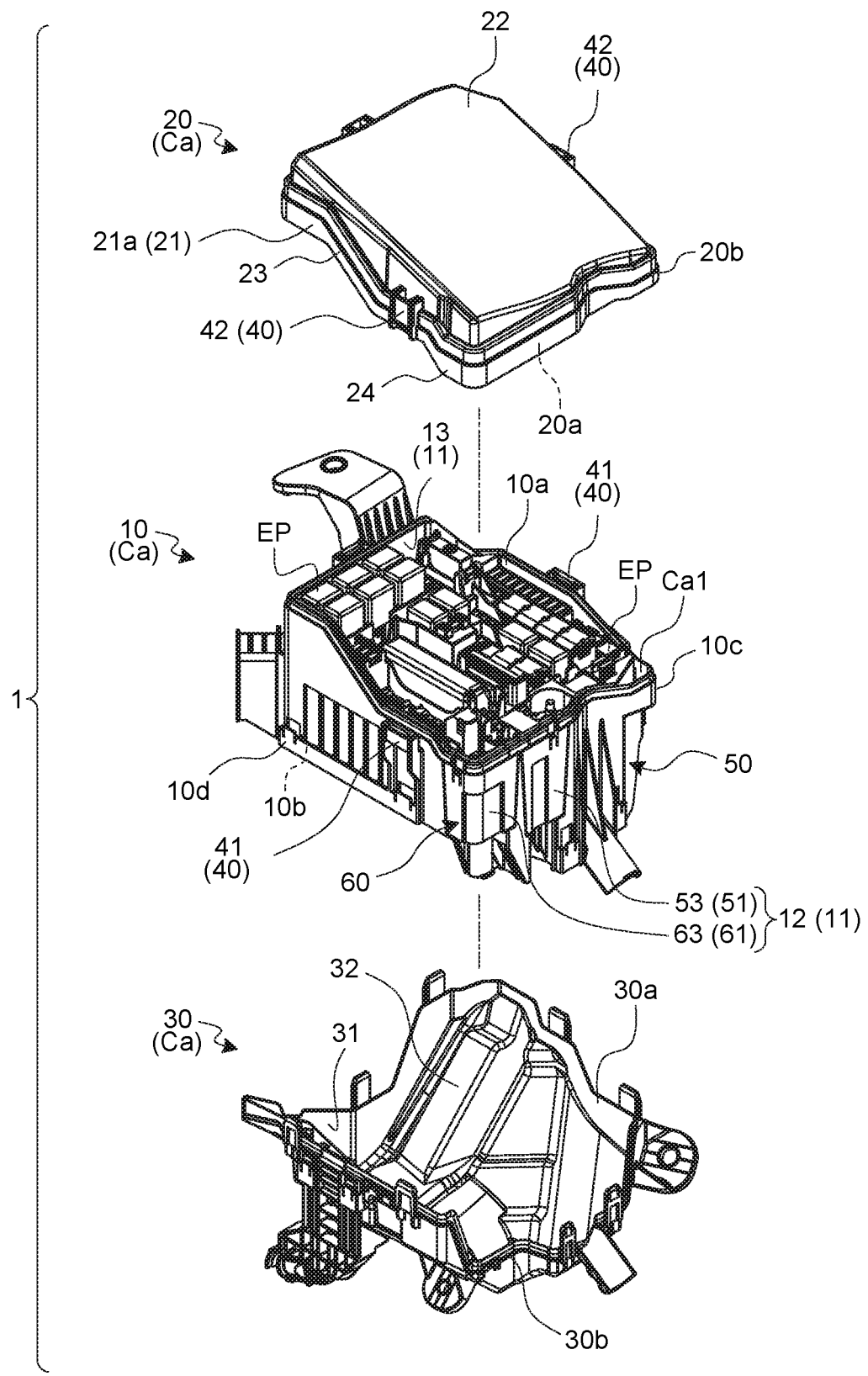
FIG. 3 is an exploded perspective view illustrating the electrical connection box in the embodiment.

Reference numeral 1 in FIG. 1 to FIG. 3 indicates the electrical connection box in the embodiment. Reference sign WH in FIG. 1 indicates the wire harness in the embodiment that includes the electrical connection box 1.

The electrical connection box 1 in the embodiment includes a housing Ca accommodating therein electronic components EP and electric wires (a power supply line, a signal line, and the like) We that are electrically connected to the electronic components EP (FIG. 3). The electrical connection box 1 electrically connects connection targets (not illustrated) to the electronic components EP via the electric wires We. In the electrical connection box 1, the electric wires We are electrically connected to the electronic components EP in the housing Ca and the electronic components EP are electrically connected to the connection targets via the electric wires We drawn out to the outer side from the inner side of the housing Ca. The electrical connection box 1 configures the wire harness WH together with the electronic components EP and the electric wires We.

The electronic components EP indicate, for example, circuit protection components such as a relay and a fuse, a connector, and a terminal fitting. Electronic devices such as a circuit board and an electronic control unit (what is called ECU) are also considered to be one form of the electronic components EP. The connection targets indicate a power source such as a secondary battery, a load such as an electric device (actuator or the like), a sensor, and the like. In the electrical connection box 1, for example, one electric wire We is electrically connected to the power source, another electric wire We is electrically connected to the load, and the power source and the load are electrically connected to each other with the electronic component EP interposed therebetween.

The housing Ca is molded by an insulating material such as synthetic resin. The housing Ca is an accommodation box formed by assembling a plurality of divided housings (FIG. 1 to FIG. 3) and has an accommodation chamber Ca1 accommodating therein the electronic components EP and the electric wires We (FIG. 3). In the housing Ca, the accommodation chamber Ca1 of the electronic components EP are formed therein by the assembled divided housings.

The housing Ca includes, as the divided housings, at least a first divided housing and a second divided housing having annular peripheral edge portions of openings formed by outer peripheral walls that are fitted with each other. In this example, the housing Ca includes, as the divided housings, a first divided housing 10, a second divided housing 20, and a third divided housing 30 (FIG. 1 to FIG. 3).

The first divided housing 10 has a cylindrical shape with open ends and indicates what is called a frame (FIG. 3). The first divided housing 10 has a cylindrical outer peripheral wall 11 with open ends in the cylindrical axial direction and the inside of the outer peripheral wall 11 is used as the accommodation chamber Ca1. The second divided housing 20 is a lid member closing an opening (first opening) 10a of the first divided housing 10 at one end in the cylindrical axial direction (FIG. 3). The second divided housing 20 has a cylindrical outer peripheral wall 21 and a closing wall 22 closing one end of the outer peripheral wall 21 in the cylindrical axial direction (FIG. 1 and FIG. 3). An opening 20a is provided in the second divided housing 20 at the other end of the outer peripheral wall 21 in the cylindrical axial direction (FIG. 3). The third divided housing 30 is a lid member closing an opening (second opening) 10b of the first divided housing 10 at the other end in the cylindrical axial direction (FIG. 3). The third divided housing 30 has a cylindrical outer peripheral wall 31 and a closing wall 32 closing one end of the outer peripheral wall 31 in the cylindrical axial direction (FIG. 3). An opening 30a is provided in the third divided housing 30 at the other end of the outer peripheral wall 31 in the cylindrical axial direction (FIG. 3). One of the second divided housing 20 and the third divided housing 30 is referred to as what is called an upper cover and the other thereof is what is called a lower cover. In this example, the second divided housing 20 is used as the upper cover and the third divided housing 30 is used as the lower cover.

The first divided housing 10 and the second divided housing 20 are integrated with each other by fitting annular peripheral edge portions 10c and 20b of the openings (the first opening 10a and the opening 20a) formed by the outer peripheral walls 11 and 21 (FIG. 1 and FIG. 3).

The outer peripheral wall 11 of the first divided housing 10 is formed to have what is called a double wall structure having an annular outer peripheral wall body 12 on the outer side and an annular inner peripheral wall body 13 on the inner side (FIG. 3). The outer peripheral wall body 12 and the inner peripheral wall body 13 are arranged so as to oppose each other with a gap therebetween. The peripheral edge portion 10c of the outer peripheral wall 11 of the first divided housing 10 therefore has the double wall structure by the outer peripheral wall body 12 and the inner peripheral wall body 13. The peripheral edge portion 20b of the outer peripheral wall 21 of the second divided housing 20 is formed to have what is called a double wall structure having an annular outer peripheral wall body 21a on the outer side and an annular inner peripheral wall body 21b on the inner side (FIG. 2). The outer peripheral wall body 21a and the inner peripheral wall body 21b are arranged so as to oppose each other with a gap therebetween. The peripheral edge portions 10c and 20b of the first divided housing 10 and the second divided housing 20 are fitted with each other by fitting the inner peripheral wall body 21b of the second divided housing 20 in between the outer peripheral wall body 12 and the inner peripheral wall body 13 in the peripheral edge portion 10c of the first divided housing 10 and fitting the outer peripheral wall body 12 of the first divided housing 10 on the peripheral edge portion 10c side in between the outer peripheral wall body 21a and the inner peripheral wall body 21b of the second divided housing 20.

The housing Ca includes lock structures (hereinafter, referred to as "housing lock structures") 40 for holding the first divided housing 10 and the second divided housing 20 in a completely fitted state (FIG. 1 and FIG. 3). The housing lock structures 40 include first engagement bodies (hereinafter, referred to as "first housing-side engagement bodies") 41 and second engagement bodies (hereinafter, referred to as "second housing-side engagement bodies") 42 that are locked by each other to be made into completely engaged states when the first divided housing 10 and the second divided housing 20 are made into the completely fitted state and hold the first divided housing 10 and the second divided housing 20 in the completely fitted state. In the housing lock structures 40, the first housing-side engagement bodies 41 are provided on the outer peripheral wall 11 of the first divided housing 10 and the second housing-side engagement bodies 42 are provided on the outer peripheral wall 21 of the second divided housing 20. The first housing-side engagement bodies 41 and the second housing-side engagement bodies 42 are formed to have locking portions that are locked by each other in an opposite direction to the fitting direction of the first divided housing 10 and the second divided housing 20 when the first divided housing 10 and the second divided housing 20 are made into the completely fitted state. For example, the first housing-side engagement bodies 41 and the second housing-side engagement bodies 42 are formed such that at least one each of the locking portions thereof is formed as a claw-shaped claw portion and the claw portion can be hooked on the other locking portion.

The first divided housing 10 and the third divided housing 30 are integrated with each other by fitting annular peripheral edge portions 10d and 30b of the openings (the second opening 10b and the opening 30a) formed by the outer peripheral walls 11 and 31 (FIG. 1 and FIG. 3). Both of the outer peripheral walls 11 and 31 may have the double wall structures like those between the first divided housing 10 and the second divided housing 20 or only one of them may have the double wall structure. Housing lock structures similar to those provided between the first divided housing 10 and the second divided housing 20 are provided between the first divided housing 10 and the third divided housing 30.

The first divided housing 10 is formed by assembling a plurality of assembly members on each other. The first divided housing 10 in this example includes, as the assembly members, a first assembly member 50 and a second assembly member 60 (FIG. 1 to FIG. 5). In the first divided housing 10, a first outer wall body 51 of the first assembly member 50 and a second outer wall body 61 of the second assembly member 60 form the cylindrical outer peripheral wall 11 (FIG. 1 and FIG. 3 to FIG. 5).

Figure 4:
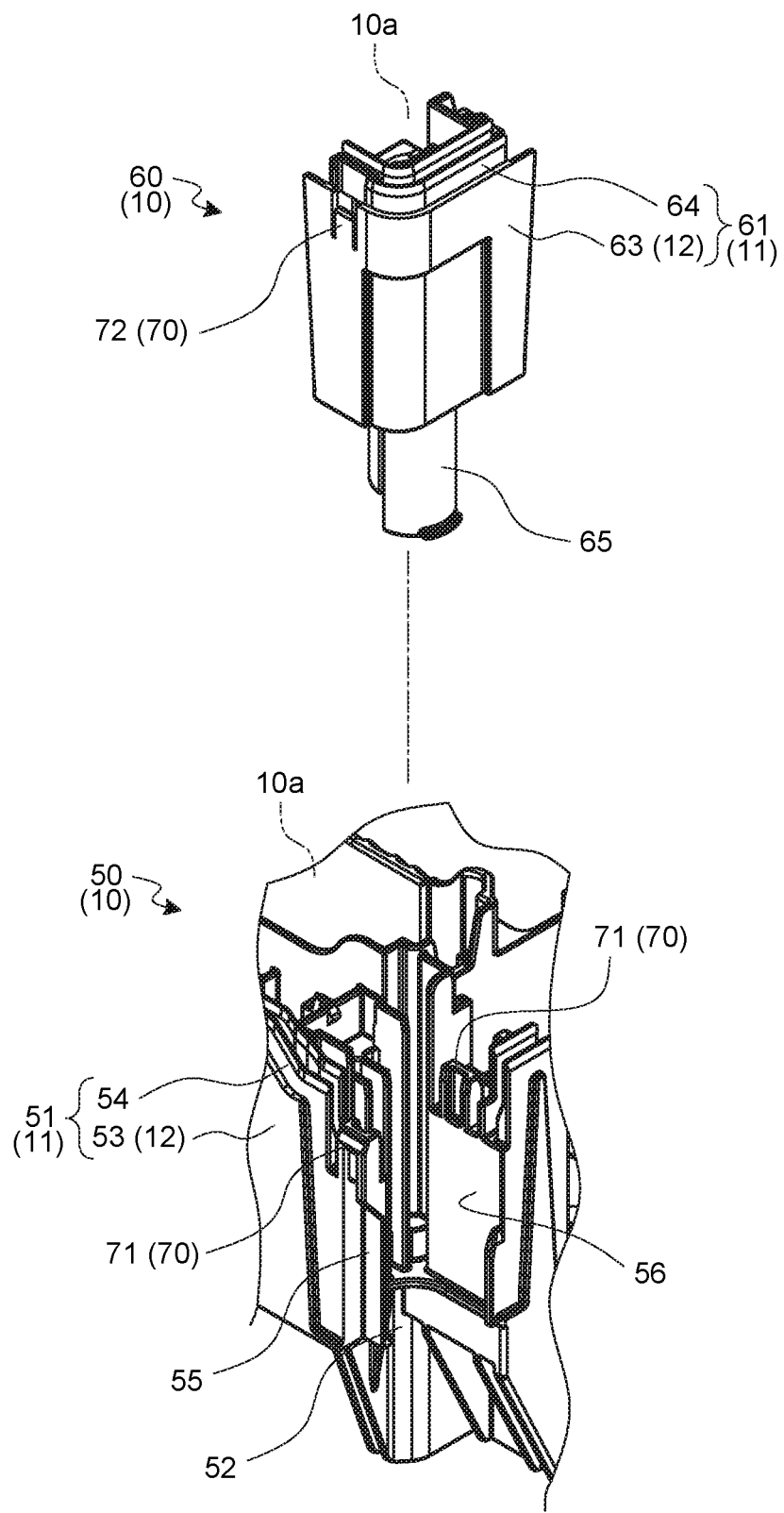
FIG. 4 is an exploded perspective view of a first divided housing and is a partially enlarged view of a portion around a cutout portion.

The first assembly member 50 forms a main body of the first divided housing 10. A cutout portion 52 is formed in the first outer wall body 51 of the first assembly member 50 (FIG. 4). The cutout portion 52 in this example is formed from the first opening 10a to the second opening 10b. The first outer wall body 51 of the first assembly member 50 is therefore formed to have a substantially cylindrical shape a part of which is cut out from the first opening 10a to the second opening 10b. The cutout portion 52 in this example is provided in a corner portion of the first outer wall body 51. In the first divided housing 10, the electric wire We on the inner side of the cutout portion 52 is wired to be drawn out to the outer side of the housing Ca from the second opening 10b side.

Figure 5:
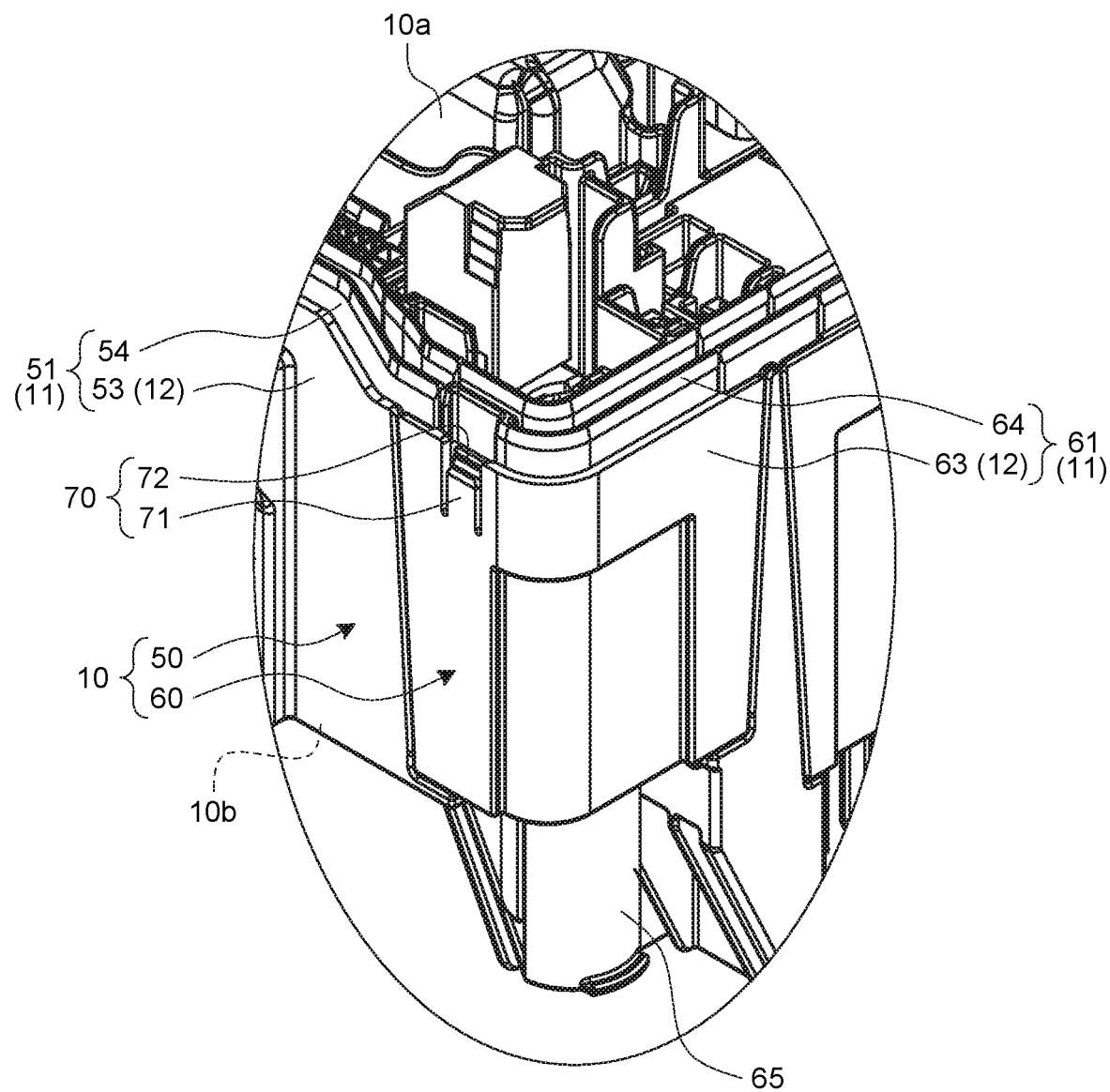
FIG. 5 is a partially enlarged view of the portion around the cutout portion of the first divided housing.

The first outer wall body 51 forms the outer peripheral wall 11 of the first divided housing 10 together with the second outer wall body 61 of the second assembly member 60 and has the double wall structure. The first outer wall body 51 therefore has an outer peripheral wall body 53 as a main body of the outer peripheral wall body 12 of the first divided housing 10 and an inner peripheral wall body 54 as a main body of the inner peripheral wall body 13 of the first divided housing 10 (FIG. 4 and FIG. 5). The cutout portion 52 is formed in the first assembly member 50 by cutting both of the outer peripheral wall body 53 and the inner peripheral wall body 54 from the first opening 10a to the second opening 10b.

Figure 6:
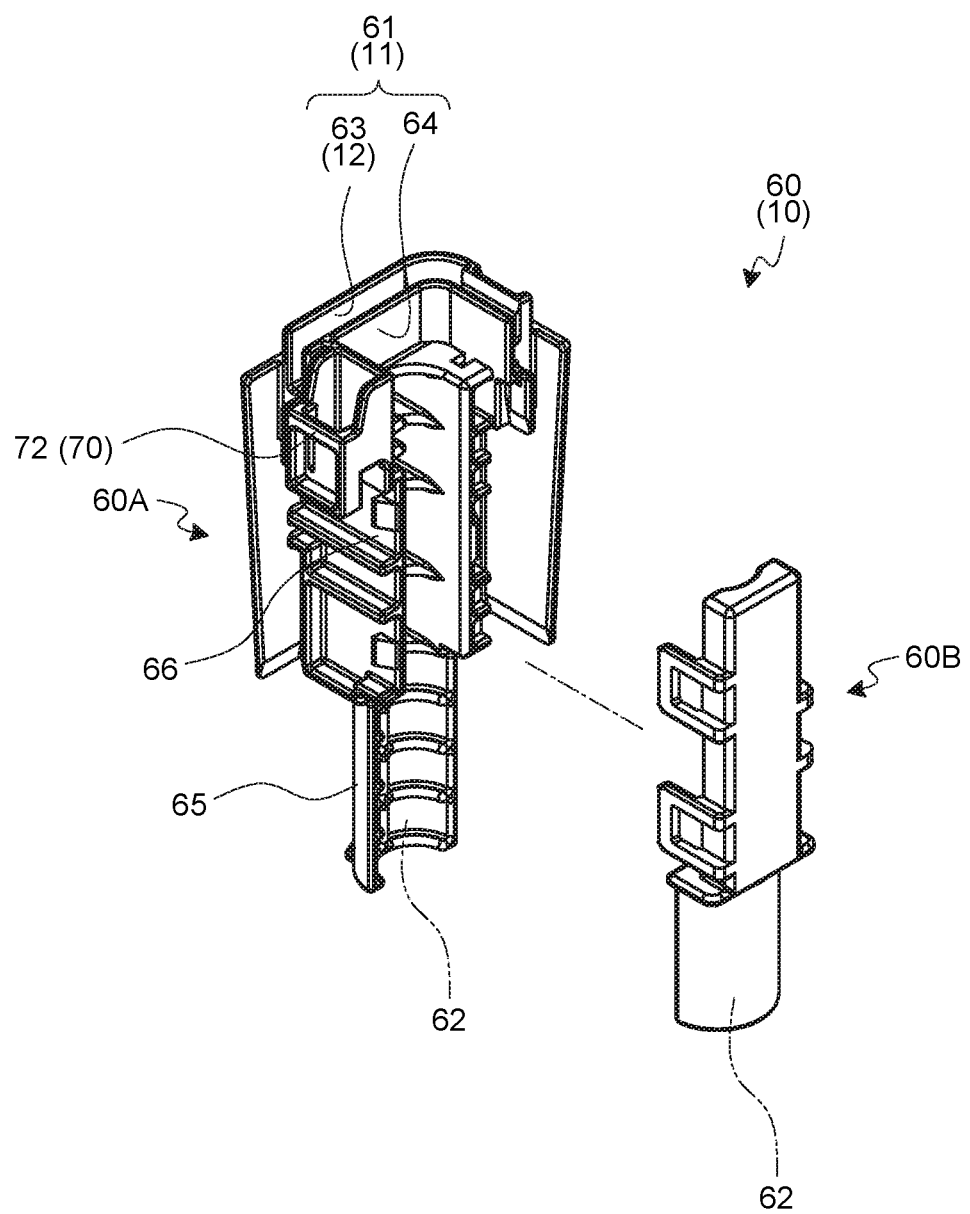
FIG. 6 is an exploded perspective view illustrating a second assembly member.

The second assembly member 60 is a member for wiring the electric wire We on the inner side of the cutout portion 52 of the first assembly member 50 and is provided to embed the cutout portion 52. The second assembly member 60 in this example is formed to have a cylindrical shape by first and second constituent members 60A and 60B assembled on each other and enables the wire We passing through a space 62 therein to be drawn out to the outer side of the housing Ca (FIG. 6). In the housing Ca, the third divided housing 30 does not cover the second assembly member 60 on the second opening 10b side and the space 62 of the second assembly member 60 is made to communicate with the outer side. The space 62 is formed to have a columnar shape and is arranged while making the axial direction thereof identical to the cylindrical axial direction of the first divided housing 10. In this example, the second outer wall body 61 is provided on the first constituent member 60A.

In the second assembly member 60, the second outer wall body 61 embeds the cutout portion 52 with assembly on the first assembly member 50. The second outer wall body 61 forms the outer peripheral wall 11 of the first divided housing 10 together with the first outer wall body 51 of the first assembly member 50. The second outer wall body 61 in this example is therefore formed to have a shape (L shape herein) along the corner portion of the first outer wall body 51.

To be specific, the second outer wall body 61 has an outer peripheral wall body 63 forming the outer peripheral wall body 12 of the first divided housing 10 together with the outer peripheral wall body 53 of the first outer wall body 51 (FIG. 1, FIG. 4, and FIG. 5). The outer peripheral wall body 63 extends between the first opening 10a and the second opening 10b. The outer peripheral wall body 63 in this example is formed into an L shape with a plate thickness reduced to be smaller than that of the outer peripheral wall body 53 of the first outer wall body 51 and is arranged such that the outer wall surface thereof is flush with that of the outer peripheral wall body 53. The second outer wall body 61 is made to have flexibility so as to be capable of deflecting in the direction intersecting with its own inner wall surface and outer wall surface. The outer peripheral wall body 63 has such flexibility by reducing the plate thickness of the outer peripheral wall body 63.

The second outer wall body 61 has an inner peripheral wall body 64 on the inner side of the outer peripheral wall body 63 and the peripheral edge portion 20b side, the inner peripheral wall body 64 being arranged so as to oppose the outer peripheral wall body 63 with a gap therebetween (FIG. 4 and FIG. 5). The inner peripheral wall body 64 on the first opening 10a side has the double wall structure into which the inner peripheral wall body 21b of the second divided housing 20 is fitted.

The second assembly member 60 has, on the inner side of the inner peripheral wall body 64, a semi-cylindrical wall body 65 that forms the space 62 of the second assembly member 60 together with the semi-cylindrical second constituent member 60B on the inner side (FIG. 1 and FIG. 6).

The semi-cylindrical wall body 65 and the second constituent member 60B are made to project to the third divided housing 30 side relative to the second opening 10b in the cylindrical axial direction of the first divided housing 10.

The first assembly member 50 and the second assembly member 60 in this example are assembled on each other while being relatively moved in the direction along the inner wall surface and the outer wall surface of the outer peripheral wall body 53 and the inner wall surface and the outer wall surface of the outer peripheral wall body 63 and the direction along the cylindrical axial direction of the first divided housing 10. The second assembly member 60 is assembled on the first assembly member 50 while being relatively moved from the first opening 10a side.

The first divided housing 10 includes a lock structure 70 for holding the first assembly member 50 and the second assembly member 60 in a completely assembled state (FIG. 2, FIG. 4, and FIG. 5). The lock structure 70 is formed to be locked in the locking direction along the inner wall surface and the outer wall surface of the second outer wall body 61 to be made into a completely engaged state when the first assembly member 50 and the second assembly member 60 are made into the completely assembled state and thereby hold the first assembly member 50 and the second assembly member 60 in the completely assembled state. The lock structure 70 includes a first engagement body 71 provided on the first assembly member 50 and a second engagement body 72 provided on the second assembly member 60.

In this example, the first engagement body 71 and the second engagement body 72 are locked by each other in the locking direction along the inner wall surface and the outer wall surface of the outer peripheral wall body 63 of the second outer wall body 61. The locking direction is opposite to the assembly direction of the first assembly member 50 and the second assembly member 60. That is to say, the first engagement body 71 and the second engagement body 72 are formed to be locked by each other in the opposite direction to the assembly direction of the first assembly member 50 and the second assembly member 60 when the first assembly member 50 and the second assembly member 60 are made into the completely assembled state. In other words, the first assembly member 50 and the second assembly member 60 are formed to be assembled on each other along the assembly direction opposite to the locking direction.

The first engagement body 71 is provided on the first assembly member 50 on the inner side relative to the cutout portion 52. The second engagement body 72 is provided on the second outer wall body 61 of the second assembly member 60 on the inner wall surface side. In the first assembly member 50, an opposing wall body 55 is continuously provided from the inner peripheral wall body 54 to a position at which the first engagement body 71 is arranged and the first engagement body 71 is provided on the opposing wall body 55 in order that the first engagement body 71 and the second engagement body 72 are arranged so as to oppose each other and are made into the completely engaged state when the first assembly member 50 and the second assembly member 60 are made into the completely assembled state (FIG. 2 and FIG. 4). The opposing wall body 55 is arranged so as to oppose the inner wall surface of a part of the outer peripheral wall body 63 of the second outer wall body 61. On the other hand, the second engagement body 72 in this example is provided on the outer peripheral wall body 63 of the second outer wall body 61 on the inner wall surface side.

The first engagement body 71 and the second engagement body 72 have locking portions 71a and 72a that are locked by each other in the locking direction when the first assembly member 50 and the second assembly member 60 are in the completely assembled state (FIG. 2). The locking portions 71a and 72a are both formed to climb on each other, and then, climb over each other in conjunction with the assembly operation of the first assembly member 50 and the second assembly member 60. Furthermore, the locking portions 71a and 72a are locked by each other in the locking direction in the state after both climb over each other to cause the first engagement body 71 and the second engagement body 72 to be made into the completely engaged state. At least one of the locking portions 71a and 72a is therefore made to project to the other side as a locking target. For example, the locking portions 71a and 72a are formed such that at least one of them is formed as a claw-shaped claw portion and the claw portion is hooked on the other locking portion. In this example, the locking portion 72a of the second engagement body 72 is formed into the claw shape and the locking portion 72a is made to project from the inner wall surface of the outer peripheral wall body 63 of the second outer wall body 61.

The peripheral edge portion 20b of the outer peripheral wall 21 of the second divided housing 20 has an annular first fitting portion 23 that is fitted with the outer wall surface of the peripheral edge portion 10c of the outer peripheral wall 11 of the first divided housing 10 when the first divided housing 10 and the second divided housing 20 are in the completely fitted state (FIG. 2 and FIG. 3). The first fitting portion 23 in this example is formed by the outer peripheral wall body 21a and the inner peripheral wall body 21b of the peripheral edge portion 20b.

Furthermore, the peripheral edge portion 20b has a second fitting portion 24 that is fitted with the outer wall surface of the second outer wall body 61 on the opposite side to the second engagement body 72 when the first divided housing 10 and the second divided housing 20 are in the completely fitted state (FIG. 2 and FIG. 3). With this configuration, when the first divided housing 10 and the second divided housing 20 are fitted with each other, the second outer wall body 61 having flexibility deflects to the outer side in the half-engaged state where both the locking portions 71a and 72a of the first engagement body 71 and the second engagement body 72 climb on each other in the direction intersecting with the locking direction, so that the second fitting portion 24 abuts against the second outer wall body 61 and the first divided housing 10 and the second divided housing 20 are not made into the completely fitted state. In the housing Ca, it can be detected from the above-mentioned result that the first engagement body 71 and the second engagement body 72 are in the half-engaged state and the first assembly member 50 and the second assembly member 60 are not made into the completely assembled state.

The second fitting portion 24 is arranged so as to oppose, in a fitted state, the outer wall surface of the second outer wall body 61 on the opposite side to the second engagement body 72 when the first divided housing 10 and the second divided housing 20 are in the completely fitted state. The second fitting portion 24 in this example is made to project from the outer peripheral wall body 21a forming the first fitting portion 23 on the same plane and the inner wall surface thereof is fitted with the outer wall surface of the outer peripheral wall body 63 on the opposite side to the second engagement body 72 in the opposing arrangement direction.

The first engagement body 71 and the second engagement body 72 are formed to cause the second outer wall body 61 to deflect in the half-engaged state of the locking portions 71a and 72a and cause the second outer wall body 61 to be pressed into a fitting trajectory of the peripheral edge portion 20b of the outer peripheral wall 21 of the second divided housing 20 when the first divided housing 10 and the second divided housing 20 are fitted with each other. In the second outer wall body 61 in this example, the outer peripheral wall body 63 on which the second engagement body 72 is provided has flexibility. The first engagement body 71 and the second engagement body 72 in this example are therefore formed to cause the outer peripheral wall body 63 to deflect in the half-engaged state of the locking portions 71a and 72a and cause the outer peripheral wall body 63 in the deflecting state to be pressed into the fitting trajectory of the peripheral edge portion 20b of the outer peripheral wall 21 of the second divided housing 20 when the first divided housing 10 and the second divided housing 20 are fitted with each other. With this configuration, when the first divided housing 10 and the second divided housing 20 are fitted with each other, the second fitting portion 24 abuts against the outer peripheral wall body 63 of the second outer wall body 61 and the first divided housing 10 and the second divided housing 20 are not made into the completely fitted state in the half-engaged state of the locking portions 71a and 72a of the first engagement body 71 and the second engagement body 72. In this example, it can be detected from the above-mentioned result that the first engagement body 71 and the second engagement body 72 are in the half-engaged state and the first assembly member 50 and the second assembly member 60 are not made into the completely assembled state.

A periphery of the second assembly member 60 on the second opening 10b side is not covered by the third divided housing 30 in order to enable the electric wire We to be drawn out to the outer side from the space 62. In this example, the opposing wall body 55 is made to extend to the second opening 10b side, and two wall surfaces connecting the outer peripheral wall body 63 and the opposing wall body 55 in an opposing arrangement state with a gap therebetween are respectively provided on the first assembly member 50 and the second assembly member 60. The two wall surfaces are arranged so as to oppose each other with a gap therebetween and are made to extend to the second opening 10b side. In the first divided housing 10, a cuboidal space S continuous to the second opening 10b side is thereby formed on the lower side relative to the lock structure 70 (FIG. 2). Accordingly, in the housing Ca, even when liquid such as water enters the periphery of the second assembly member 60 on the second opening 10b side and the liquid enters from an opening Sa of the space S, the liquid does not reach the lock structure 70 and is discharged from the opening Sa by its own weight. The housing Ca can thereby prevent entrance of liquid into the accommodation chamber Ca1 side from a gap between the first engagement body 71 and the second engagement body 72.

An opposing wall body 56 arranged so as to oppose the opposing wall body 55 with the semi-cylindrical wall body 65 interposed therebetween is provided on the first assembly member 50 in this example (FIG. 2 and FIG. 4). The opposing wall body 56 extends to the second opening 10b side. An opposing wall body 66 arranged so as to oppose the opposing wall body 56 on the opposite side to the semi-cylindrical wall body 65 is provided on the second assembly member 60 in this example (FIG. 2 and FIG. 6). The opposing wall body 66 is arranged so as to oppose the opposing wall body 56 on the first opening 10b side. Another lock structure 70 having the same configuration as that of the above-mentioned lock structure 70 is provided between the first assembly member 50 and the second assembly member 60. The lock structure 70 includes the first engagement body 71 provided on the opposing wall body 56 on the first opening 10b side and the second engagement body 72 provided on the opposing wall body 66.

In the housing Ca, another space S similar to that on the lower side of the above-mentioned lock structure 70 is also provided on the lower side of the other lock structure 70. The space S is formed by the opposing wall body 56, an opposing wall body 57 arranged so as to oppose the opposing wall body 56 with a gap therebetween on the opposite side to the semi-cylindrical wall body 65, and wall surfaces that connect the opposing wall bodies 56 and 57 in the opposing arrangement direction and are respectively provided on the first assembly member 50 and the second assembly member 60. The two wall surfaces are arranged so as to oppose each other with a gap therebetween and are made to extend to the second opening 10b side in the same manner as those mentioned above. In the housing Ca, even when liquid enters from the opening Sa of the other space S, the liquid does not reach the lock structure 70 above it and is discharged from the opening Sa by its own weight. The housing Ca can thereby prevent entrance of liquid into the accommodation chamber Ca1 side from the gap between the first engagement body 71 and the second engagement body 72 also at the corresponding place.

As described above, in the electrical connection box 1 according to the embodiment, in the completely fitted state of the first divided housing 10 and the second divided housing 20, the lock structure 70 on the outer side in the first divided housing 10 is covered by the second fitting portion 24 of the second divided housing 20 and the second fitting portion 24 is arranged so as to oppose, in the fitted state, the outer wall surface of the outer peripheral wall body 63 of the second outer wall body 61 on which the first engagement body 71 of the lock structure 70 is provided. With this configuration, when the first divided housing 10 and the second divided housing 20 are fitted with each other, the outer peripheral wall body 63 of the second outer wall body 61 having flexibility deflects to the outer side in the half-engaged state of the locking portions 71a and 72a of the first engagement body 71 and the second engagement body 72, so that the second fitting portion 24 abuts against the outer peripheral wall body 63 of the second outer wall body 61 and the first divided housing 10 and the second divided housing 20 are not made into the completely fitted state. In the electrical connection box 1 in the embodiment, it can be detected from the above-mentioned result that the first engagement body 71 and the second engagement body 72 are in the half-engaged state and the first assembly member 50 and the second assembly member 60 are not made into the completely assembled state. Thus, the electrical connection box 1 in the embodiment can detect erroneous assembly between the assembly members and can reassemble the assembly members in a correct state. Accordingly, the electrical connection box 1 in the embodiment enables the first divided housing 10 and the second divided housing 20 to be assembled on each other in the completely fitted state and can prevent entrance of foreign matters from the gaps between the assembly members. Furthermore, the wire harness WH in the embodiment includes the electrical connection box 1 and can therefore provide the same effects as those provided by the electrical connection box 1.

In the electrical connection box according to the present embodiment, when the first divided housing and the second divided housing are in the completely fitted state, the lock structure in the first divided housing is covered by the second fitting portion of the second divided housing and the second fitting portion is arranged so as to oppose, in the fitted state, the outer wall surface of the second outer wall body on which the first engagement body of the lock structure is provided. With this configuration, when the first divided housing and the second divided housing are fitted with each other, the second outer wall body having flexibility deflects to the outer side in the half-engaged state of the first engagement body and the second engagement body, so that the second fitting portion abuts against the second outer wall body and the first divided housing and the second divided housing are not made into the completely fitted state. In the electrical connection box according to the present embodiment, it can be detected from the above-mentioned result that the first engagement body and the second engagement body are in the half-engaged state and the first assembly member and the second assembly member are not made into the completely assembled state. Furthermore, the wire harness according to the present invention includes the electrical connection box and can therefore provide the same effects as those provided by the electrical connection box.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box comprising:
a housing in which an accommodation chamber of an electronic component is formed by a plurality of assembled divided housings and that enables an electric wire electrically connected to the electronic component to be drawn out to an outer side, wherein
the housing includes, as the divided housings, at least a first divided housing and a second divided housing having annular peripheral edge portions of openings formed by outer peripheral walls that are fitted with each other,
the first divided housing includes a first assembly member having a first outer wall body in which a cutout portion is formed, a second assembly member embedding the cutout portion with assembly on the first assembly member and having a second outer wall body forming the outer peripheral wall of the first divided housing together with the first outer wall body, and a lock structure holding the first assembly member and the second assembly member in a completely assembled state,
the second outer wall body has flexibility capable of deflecting in a direction intersecting with an inner wall surface and an outer wall surface of the second outer wall body,
the lock structure includes a first engagement body of the first assembly member and a second engagement body of the second assembly member that are locked by each other in a locking direction along the inner wall surface and the outer wall surface of the second outer wall body to be made into a completely engaged state when the first assembly member and the second assembly member are made into the completely assembled state and hold the first assembly member and the second assembly member in the completely assembled state, the first engagement body is provided on the first assembly member on an inner side relative to the cutout portion, the second engagement body is provided on the second outer wall body on the inner wall surface side, the peripheral edge portion of the outer peripheral wall of the second divided housing has an annular first fitting portion that is fitted with an outer wall surface of the peripheral edge portion of the outer peripheral wall of the first divided housing when the first divided housing and the second divided housing are in a completely fitted state, and a second fitting portion that is fitted with the outer wall surface of the second outer wall body on an opposite side to the second engagement body when the first divided housing and the second divided housing are in the completely fitted state, and the first engagement body and the second engagement body have locking portions that are locked by each other in the locking direction when the first assembly member and the second assembly member are in the completely assembled state and are formed to cause the second outer wall body to deflect in a half-engaged state where the locking portions climb on each other in a direction intersecting with the locking direction and cause the second outer wall body to be pressed into a fitting trajectory of the peripheral edge portion of the outer peripheral wall of the second divided housing when the first divided housing and the second divided housing are fitted with each other.

2. The electrical connection box according to claim 1, wherein the second fitting portion is arranged so as to oppose, in a fitted state, the outer wall surface of the second outer wall body on the opposite side to the second engagement body when the first divided housing and the second divided housing are in the completely fitted state.

3. The electrical connection box according to claim 1, wherein at least one of the locking portions is made to project to the other side as a locking target.

4. The electrical connection box according to claim 1, wherein the first assembly member and the second assembly member are formed to be assembled on each other along an assembly direction as an opposite direction to the locking direction, and the locking portions are both formed to climb on each other, and then, climb over each other in conjunction with an assembly operation of the first assembly member and the second assembly member, and the locking portions are locked by each other in the locking direction in a state after the locking portions climb over each other to cause the first engagement body and the second engagement body to be made into the completely engaged state.

5. The electrical connection box according to claim 3, wherein the first assembly member and the second assembly member are formed to be assembled on each other along an assembly direction as an opposite direction to the locking direction, and the locking portions are both formed to climb on each other, and then, climb over each other in conjunction with an assembly operation of the first assembly member and the second assembly member, and the locking portions are locked by each other in the locking direction in a state after the locking portions climb over each other to cause the first engagement body and the second engagement body to be made into the completely engaged state.

6. A wire harness comprising:

an electronic component;

an electric wire that is electrically connected to the electronic component; and a housing in which an accommodation chamber of the electronic component is formed by a plurality of assembled divided housings and that enables the electric wire to be drawn out to an outer side, wherein the housing includes, as the divided housings, at least a first divided housing and a second divided housing having annular peripheral edge portions of openings formed by outer peripheral walls that are fitted with each other, the first divided housing includes a first assembly member having a first outer wall body in which a cutout portion is formed, a second assembly member embedding the cutout portion with assembly on the first assembly member and having a second outer wall body forming the outer peripheral wall of the first divided housing together with the first outer wall body, and a lock structure holding the first assembly member and the second assembly member in a completely assembled state, the second outer wall body has flexibility capable of deflecting in a direction intersecting with an inner wall surface and an outer wall surface of the second outer wall body, the lock structure includes a first engagement body of the first assembly member and a second engagement body of the second assembly member that are locked by each other in a locking direction along the inner wall surface and the outer wall surface of the second outer wall body to be made into a completely engaged state when the first assembly member and the second assembly member are made into the completely assembled state and hold the first assembly member and the second assembly member in the completely assembled state, the first engagement body is provided on the first assembly member on an inner side relative to the cutout portion, the second engagement body is provided on the second outer wall body on the inner wall surface side, the peripheral edge portion of the outer peripheral wall of the second divided housing has an annular first fitting portion that is fitted with an outer wall surface of the peripheral edge portion of the outer peripheral wall of the first divided housing when the first divided housing and the second divided housing are in a completely fitted state and a second fitting portion that is fitted with the outer wall surface of the second outer wall body on an opposite side to the second engagement body when the first divided housing and the second divided housing are in the completely fitted state, and the first engagement body and the second engagement body have locking portions that are locked by each other in the locking direction when the first assembly member and the second assembly member are in the completely assembled state and are formed to cause the second outer wall body to deflect in a half-engaged state where the locking portions climb on each other in a direction intersecting with the locking direction and cause the second outer wall body to be pressed into a fitting trajectory of the peripheral edge portion of the outer peripheral wall of the second divided housing when the first divided housing and the second divided housing are fitted with each other.

\* \* \* \* \*